(12) United States Patent
Nienhuys et al.

(10) Patent No.: US 8,625,068 B2
(45) Date of Patent: Jan. 7, 2014

(54) LITHOGRAPHIC APPARATUS CONFIGURED TO SUPPRESS CONTAMINATION FROM PASSING INTO THE PROJECTION SYSTEM AND METHOD

(75) Inventors: Han-Kwang Nienhuys, Utrecht (NL); Peter Gerardus Jonkers, Eindhoven (NL); Alexander Marinus Arnoldus Huijberts, Veghel (NL)

(73) Assignee: ASML Netherlands B.V., Veldhoven (NL)

( * ) Notice: Subject to any disclaimer, the term of this patent is extended or adjusted under 35 U.S.C. 154(b) by 500 days.

(21) Appl. No.: 12/975,898

(22) Filed: Dec. 22, 2010

(65) Prior Publication Data

US 2012/0002182 A1  Jan. 5, 2012

Related U.S. Application Data

(60) Provisional application No. 61/289,721, filed on Dec. 23, 2009.

(51) Int. Cl.
*G03B 27/52* (2006.01)

(52) U.S. Cl.
USPC .............................................. 355/30

(58) Field of Classification Search
USPC .............................................. 355/30
See application file for complete search history.

(56) References Cited

U.S. PATENT DOCUMENTS

| 7,932,990 B2 * | 4/2011 | Namba et al. ............ 355/30 |
| 2005/0069433 A1 * | 3/2005 | Hayashi ............ 417/423.4 |

* cited by examiner

*Primary Examiner* — Peter B Kim
*Assistant Examiner* — Michelle Iacoletti
(74) *Attorney, Agent, or Firm* — Sterne, Kessler, Goldstein & Fox P.L.L.C.

(57) ABSTRACT

A lithographic apparatus includes a projection system configured to project a patterned beam of radiation onto a substrate. The projection system being provided with an opening through which the patterned beam of radiation may pass. At least part of the opening comprises a sloped surface of a wall of the projection system and a sloped surface of a mirror of the projection system.

19 Claims, 7 Drawing Sheets

LITHOGRAPHIC APPARATUS CONFIGURED TO SUPPRESS CONTAMINATION FROM PASSING INTO THE PROJECTION SYSTEM AND METHOD

CROSS REFERENCE TO RELATED APPLICATIONS

This application claim benefit under 35 U.S.C. §119(e) to U.S. Provisional Patent Application No. 61/289,721, filed Dec. 23, 2009, which is incorporated by reference herein in its entirety.

BACKGROUND

1. Field of the Invention

The present invention relates to lithographic apparatus and method.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 \lambda / NA_{PS} \qquad (1)$$

where $\lambda$ is the wavelength of the radiation used, $NA_{PS}$ is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of k1.

In order to shorten the exposure wavelength and, thus, reduce the minimum printable size, it has been proposed to use an extreme ultraviolet (EUV) radiation source. EUV radiation sources are configured to output a radiation wavelength in the range of 5-20 nm (e.g., about 13 nm). Thus, EUV radiation sources may constitute a significant step toward achieving printing of small features. Such radiation is termed extreme ultraviolet or soft x-ray, and possible sources include, for example, laser-produced plasma sources, discharge plasma sources, or synchrotron radiation from electron storage rings.

It is desirable to reduce the amount of contamination that enters some parts of an EUV lithographic apparatus. Contamination that enters a projection system of an EUV lithographic apparatus may for example accumulate on optical surfaces within the projection system, and lead to a deterioration of the operation of the apparatus (e.g., by reducing the reflectivity of mirrors present within the apparatus). One source of contamination is substrates that are exposed by the lithographic apparatus. It is not desirable to provide a window between the projection system of the lithographic apparatus and the substrate, since the window will absorb EUV radiation. Therefore, it is conventional to provide an opening between the projection system and the substrate in order to allow the EUV radiation to pass from the projection system to the substrate. There is a risk that contamination may pass through this opening into the projection system.

SUMMARY

It is desirable to improve the effectiveness with which contamination is inhibited from entering the projection system of the lithographic apparatus, compared with at least one prior art lithographic apparatus.

According to a first aspect of the invention there is provided a lithographic apparatus comprising a projection system configured to project a patterned beam of radiation onto a substrate. The projection system is provided with an opening through which the patterned beam of radiation may pass. At least part of the opening comprises a sloped surface of a wall of the projection system and a sloped surface of a mirror of the projection system.

According to a second aspect of the invention there is provided a lithographic method comprising projecting a patterned beam of radiation through an opening of a projection system onto a substrate. At least part of the projection system is held at a pressure that is higher than a pressure at the substrate such that gas flows through the opening from the projection system towards the substrate. At least part of the opening comprises a sloped surface of a wall of the projection system and a sloped surface of a mirror of the projection system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention FIG. 1 schematically depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
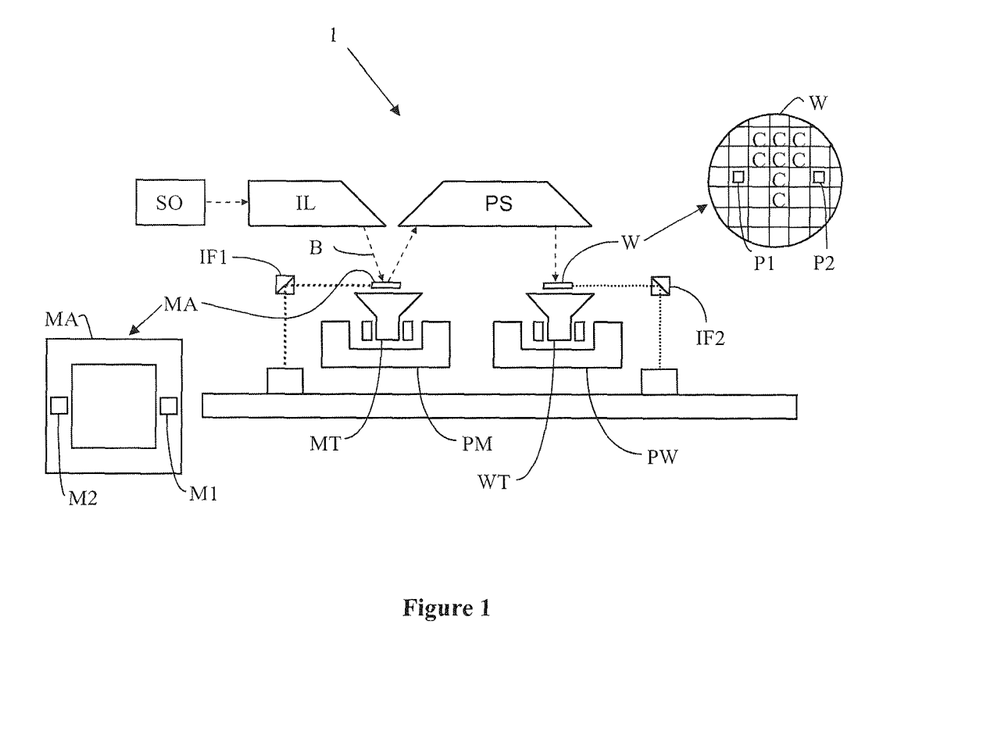

FIG. 1 schematically depicts a lithographic apparatus 1 according to an embodiment of the invention. The apparatus 1 comprises an illumination system IL (also referred to as illuminator) configured to condition a radiation beam B (e.g., EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus 1, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically, in an EUV radiation (or beyond EUV) lithographic apparatus, would be reflective. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system. Usually, in an EUV radiation lithographic apparatus the optical elements will be reflective. However, other types of optical element may be used. Any use of the term "projection lens" herein may be considered as synonymous with the more general term "projection system".

As here depicted, the apparatus 1 is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illumination system IL receives a radiation beam from a radiation source SO. The source SO and the illumination system IL may together be referred to as a radiation system.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator and a condenser. The illumination system IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW, and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 1 could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the plane of the substrate so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
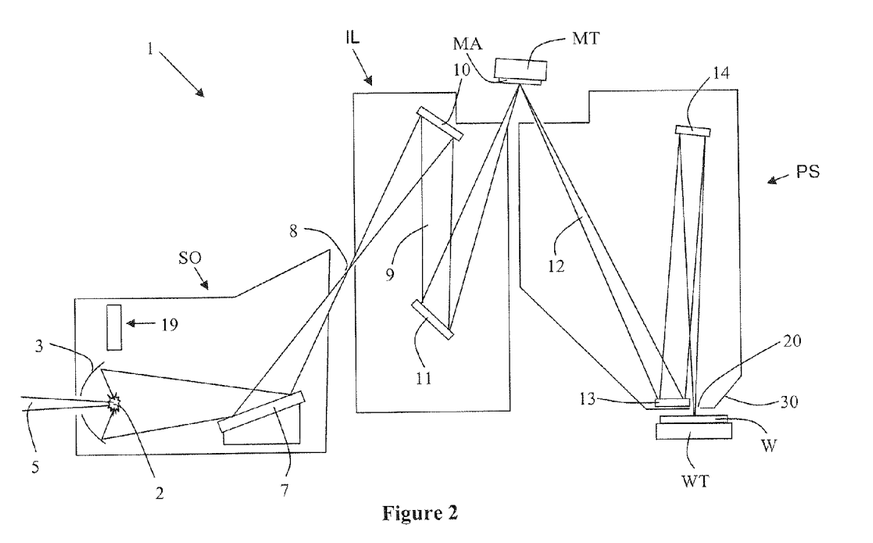
FIG. 2 is a more detailed but schematic illustration of the lithographic apparatus of FIG. 1.

FIG. 2 shows the lithographic apparatus 1 of FIG. 1 in more detail, but still in schematic form, including the radiation source SO, the illumination system IL, and the projection system PS. EUV radiation is produced by creating a plasma 2 that emits radiation in the EUV range of the electromagnetic spectrum. The plasma 2 may be created by using a laser beam 5 to irradiate of a droplet of target material provided by a target material supply 19. The droplets of target material may for example be Xe, Li or Sn.

Radiation emitted by the plasma 2 is reflected by a collector mirror 3 that is configured to focus the radiation to a focal point, thereby forming a radiation beam. In this embodiment the focal point coincides with a so-called intermediate focus 8. In this embodiment, the radiation is focused to the focal point via a grazing incidence mirror 7. In other embodiments the grazing incidence mirror 7 may be omitted. The grazing incidence mirror 7 may be a grating spectral filter 7.

The radiation beam 9 is reflected in the illumination system IL via mirrors 10, 11 onto a patterning device MA (e.g., a reticle or mask) positioned on patterning device support MT (e.g., a reticle or mask table). A patterned EUV radiation beam 12 is formed and is imaged in the projection system PS via reflective elements 13, 14 onto a substrate W on the substrate table WT.

It will be appreciated that more or fewer elements than shown in FIG. 2 may generally be present in the radiation source SO, illumination system IL, and projection system PS.

The first mirror 13 of the projection system PS is located adjacent to a lowermost surface of a wall 30 of the projection system. The projection system PS is provided with an opening 20 through which the patterned EUV radiation beam 12 passes before being incident upon the substrate W.

According to an aspect of the present invention, the projection system PS is held at a pressure that is higher than the pressure of an environment in which the substrate W is located. This difference in pressure causes gas to flow out of the opening 20 towards the substrate W. The flow of gas from the projection system towards the substrate reduces the likelihood that contamination will pass from the substrate into the projection system. The pressures in the projection system PS and at the substrate W may for example be in the range 1-30 Pa.

The flow of gas through the opening 20 suppresses contamination from passing into the projection system PS. This may be expressed as a suppression ratio R, which is the ratio between contaminant concentrations at the substrate W and in the projection system PS. The suppression ratio R may be written in terms of the Péclet number Pe:

$$R = e^{Pe} = \exp\left(\frac{QL}{DpA}\right) \quad (2)$$

where Q is the mass flow rate of the gas (in Pa m3/s), L is the suppression length (height of the opening 20), Dp is the pressure-independent product of contaminant diffusivity D and bulk gas pressure p (referred to hereafter as contaminant Dp), and A is the effective cross section of the opening 20. It can be seen from equation (2) that it is desirable for the opening 20 to have a long suppression length L and a small area A.

Figure 3A:
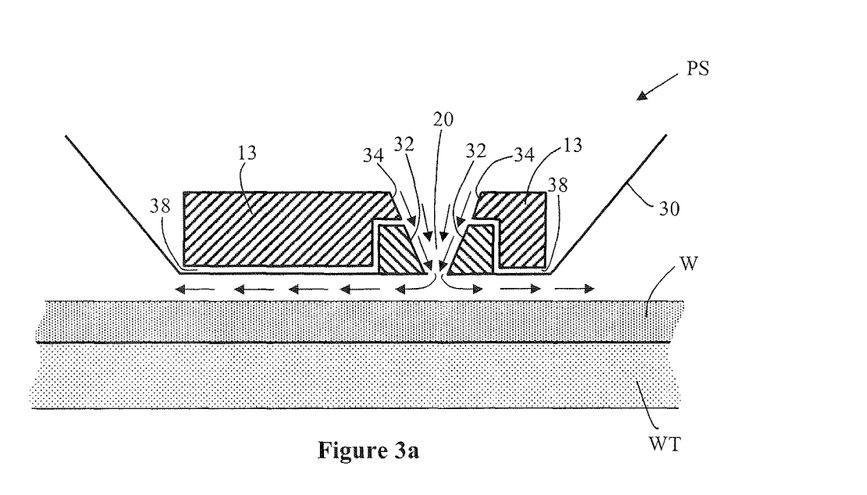
FIGS. 3*a,b* and 4 show part of a projection system of the lithographic apparatus of FIGS. 1 and 2.
Figure 3B:
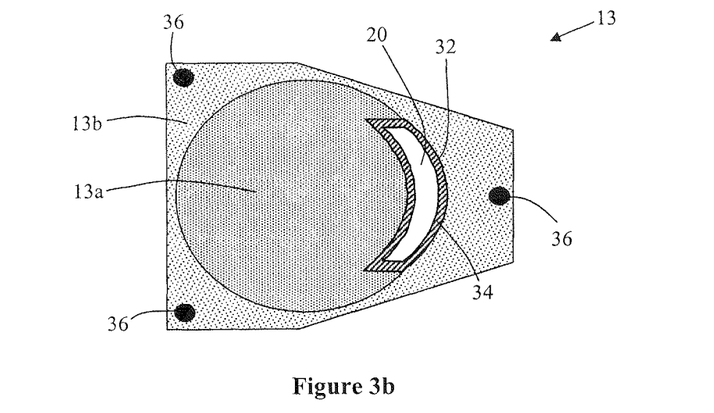

FIG. 3a shows schematically viewed from one side a lowermost end of the projection system PS that comprises the mirror 13 and part of the wall 30 of the projection system. Also shown in FIG. 3a are the substrate W and the substrate table WT. Arrows are used to schematically represent the flow of gas from the projection system PS towards the substrate W and over the surface of the substrate. FIG. 3b shows schematically the mirror 13 as viewed from above, and part of the wall of the projection system.

The opening 20 at the lowermost end of the projection system PS may be seen in FIG. 3a. Part of the opening 20 is formed by a sloped surface 32 of the projection system wall 30. The sloped surface 32 slopes upwards and outwards, thereby providing a narrowing of the opening 20 in the direction of flow of the gas. The sloped surface 32 of the projection system wall 30 is shaped to accommodate the EUV radiation beam 12 (not shown in FIG. 3), which is focused onto the substrate W through the opening 20 during operation of the lithographic apparatus.

Part of the opening 20 is also formed by a sloped surface 34 of the mirror 13. The sloped surface 34 of the mirror slopes upwards and outwards, thereby providing a narrowing of the opening 20 in the direction of flow of the gas. The sloped surface 34 of the mirror 13 is shaped to accommodate the EUV radiation beam 12 (not shown in FIG. 3), which is focused onto the substrate W through the opening 20 during operation of the lithographic apparatus. The sloped surface 32 of the projection system wall 30 and the sloped surface 34 of the mirror 13 are shown as a single surface 32, 34 in FIG. 3b for ease of illustration.

As can be seen from FIG. 3b, the mirror 13 comprises a reflective portion 13a and a supporting portion 13b. The reflective portion 13a is configured to reflect the EUV radiation beam 12 towards the next mirror 14 of the projection system PS (see FIG. 2), which then reflects the EUV radiation towards the substrate W. The supporting portion 13b is configured to support the reflective portion 13a, and is provided with three mounting points 36 to which mounting arms (not shown) are connected. Any suitable number of mounting points may be provided, at any suitable locations. The mounting arms form part of a frame (not shown), which also supports the next mirror 14 of the projection system. The frame is mechanically independent from the wall 30 of the projection system PS, and the mirror 13 may thus move relative to the wall of the projection system. A gap 38 is provided between the mirror 13 and the wall 30 of the projection system PS, in order to ensure that the minor does not touch the wall of the projection system when it moves. The gap 38 may be a few millimeters. For example, the gap may be between 1 mm and 8 mm.

The sloped surface 34 of the mirror 13 and the sloped surface 32 of the projection system wall 30 together provide a sloped surface for the opening 20, through which gas flows from the projection system PS to the substrate W.

From equation (2) it can be seen that forming the opening 20 using the sloped surface 32 of the wall 30 of the projection system and the sloped surface 34 of the mirror 13 provides more effective suppression of contaminants from the projection system PS (compared with the suppression if for example the opening 20 was formed using only the sloped surface 32 of the wall 30 of the projection system). This is because the wall 30 and the mirror 13 together provide a longer suppression length L, and the suppression ratio R is exponentially dependent upon the suppression length.

The angle of the sloped surface 34 of the mirror 13 and the sloped surface 32 of the projection system wall 30 may be matched to, or substantially matched to, the angular extent of the EUV radiation beam. From equation (2) it can be seen that effectiveness of the gas flow in suppressing contamination from entering the projection system PS increases as the effective area A of the opening 20 decrease. In an ideal system, the opening 20 would be as narrow as possible, and the angle of the sloped surfaces 32, 34 would be as close to vertical as possible (a shallower slope gives a larger effective area). The opening 20 must however accommodate the EUV radiation beam in order to allow patterns to be projected onto the substrate by the EUV radiation beam. Thus, the opening 20 may be made as narrow as possible, subject to the constraint that the opening 20 should not prevent the EUV radiation beam from projecting patterns correctly onto the substrate W. Similarly, the opening 20 may have as steep a slope as possible, subject to the constraint that the opening 20 should not prevent the EUV radiation beam from projecting patterns correctly onto the substrate W. This is achieved by matching, or substantially matching, the angle of the sloped surface 34 of the mirror 13 and the sloped surface 32 to the angular extent of the EUV radiation beam. The angle of the sloped surfaces 32, 34 may therefore depend upon the numerical aperture of the lithographic apparatus. A higher numerical aperture may require a slope that is further from the vertical (i.e., a shallower slope). The numerical aperture may for example be 0.33.

The sloped surfaces 32, 34 provide a higher suppression ratio R (for a given mass flow rate Q) than would be the case if the surfaces were vertical and spaced sufficiently far apart to accommodate the radiation beam. This is because the effective area A of the opening 20 is reduced. In this context, the term 'sloped' may be interpreted to mean not vertical if the lithographic apparatus is arranged such that the optical axis of the radiation beam is substantially vertical when the radiation beam is incident upon the substrate W. The term 'sloped' may be interpreted to mean not parallel to the optical axis of the radiation beam when the radiation beam is incident upon the substrate W.

The pressure inside the projection system PS may for example be in the range 1-30 Pa. The pressure may be selected depending upon the separation between the substrate W and the wall 30 of the projection system PS. A larger separation may require a lower pressure if a particular desired flow of gas over the substrate W is to be achieved.

Gas flows more easily if it is allowed to flow in a straight line, compared with flowing around a bend or corner. For this reason, in the illustrated embodiment of the invention the angle of the sloped surface 34 of the mirror 13 is the same (or substantially the same) as the angle of the sloped surface 32 of the projection system wall 30. In addition, the sloped surface 34 of the minor 13 is aligned with the sloped surface 32 of the projection system wall 30. In this context, the term 'aligned' is intended to mean that there is no step or substantially no step up or down when passing from the sloped surface of the mirror to the sloped surface of the projection system wall (although the gap 38 does give rise to a discontinuity). In an embodiment, the angle of the sloped surface 34 of the mirror 13 may be different to the angle of the sloped surface 32 of the projection system wall 30. Where this is the case the gas flow may be less effective in preventing contamination from entering the projection system PS. In an embodiment, there may be a step up or a step down when passing from the sloped surface of the mirror to the sloped surface of the projection system wall. Where this is the case the gas flow may be less effective in preventing contamination from entering the projection system PS.

Gas may flow through the gap 38 between the mirror 13 and the projection system wall 30. The gas may flow towards the opening 20 or may flow away from the opening. The flow of gas through the gap 38 may modify the flow of gas at and around the opening 20. However, the flow of gas through the gap 38 has only a small effect upon the suppression ratio R provided by the opening 20. In one calculation based upon possible values of pressure, separations and angles of slopes, the gap has an effect of less than 5%.

The gas flow in the gap 38 may be approximated as a concentric flow between two discs. Viscous flow of a gas from the rim of two parallel discs towards the centre can be described in terms of its pressure pA at the outside (radius RA), pressure pB at radius RB, the gap h between the discs, and the dynamic viscosity $\mu$ of the gas. From straightforward analysis, a relationship may be obtained between the mass flow rate Q and the pressures:

$$Q = \frac{\pi h^3 (p_B^2 - p_A^2)}{6\mu \ln(R_B/R_A)} = \frac{\pi h^3 2\bar{p} \Delta p}{3\mu \ln(R_B/R_A)} \quad (3)$$

where p is the mean pressure (average of pA and pB) and $\Delta p$ is the pressure difference between the outside and the inside area of the disc. The Péclet number associated with this flow is $$Pe = \int_{R_B}^{R_A} \frac{Q dR}{Dp \cdot 2\pi Rh} = \frac{h^2 \bar{p} \Delta p}{6\mu Dp} \quad (4)$$

The above equations assume that the gas flow is viscous. Given the relatively small size of the gap 38, in some instances the assumption of viscous flow may not hold completely. Where this is the case, the flow of gas through the gap 38 is likely to be less than is indicated by the equations.

Figure 4:
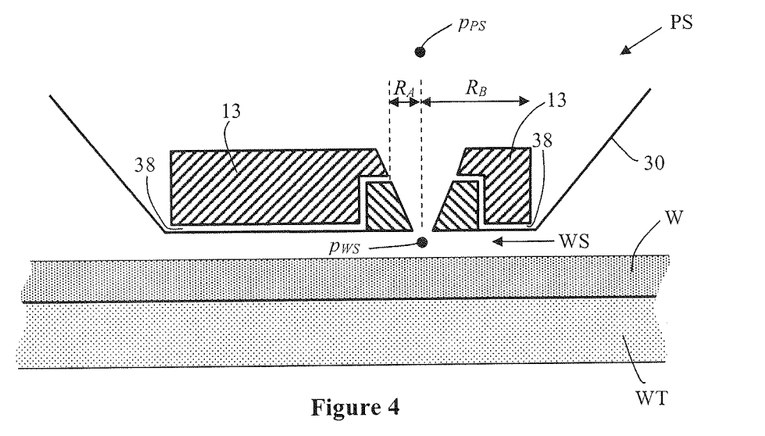

FIG. 4 shows the projection system wall 30 and mirror 13 of FIG. 3a, and includes various labeled locations and measurements that are used to estimate a possible effect of gas flow through the gap 38. Various labels that were used in connection with FIG. 3a are omitted in FIG. 4 for clarity.

Referring to FIG. 4, two pressures are relevant to the pressure calculation: the pressure pPS, in the projection system PS, and the pressure pWS in a region WS directly above the surface of the substrate W.

In an illustrative example, the following pressure values are used: pPS=19 Pa, and pWS=10 Pa. The following dimensions are used: h=2 mm (the height of the gap 38), RA=2 cm, and RB=5 cm. The gas is Hydrogen and the contaminant is water, giving the following material properties: gas viscosity $\mu$=8.8e-6 Pa s and contaminant Dp=8.5 Pa m2/s.

Using equation (3), the flow Q2 of gas through the gap 38 may be estimated based upon the above values. The estimated flow is Q2=0.055 Pa m3/s; a relatively small flow. Using equation (4), the Péclet number Pe for the gap 38 may also be estimated. The Péclet number is also relatively small: Pe=1.2. The combination of small flow and small Péclet number is such that the impact of the flow of gas through the gap 38 is relatively small.

In an alternative illustrative example, the following pressure values are used: pPS=15 Pa, and pWS=8 Pa. The following dimensions are used: h=2 mm (the height of the gap 38), RA=2 cm, and RB=5 cm. The gas is Nitrogen and the contaminant is water, giving the following material properties: $\mu$=1.8e-5 Pa s and Dp=2.5 Pa m2/s.

Using equation (3), the flow Q2 of gas through the gap 38 may be estimated based upon the above values. The estimated flow is Q2=0.016 Pa m3/s; a relatively small flow. Using equation (4), the Péclet number Pe for the gap 38 may also be estimated. The Péclet number is also relatively small: Pe=1.2. The combination of small flow and small Péclet number is such that the impact of the flow of gas through the gap 38 is relatively small.

Figure 5:
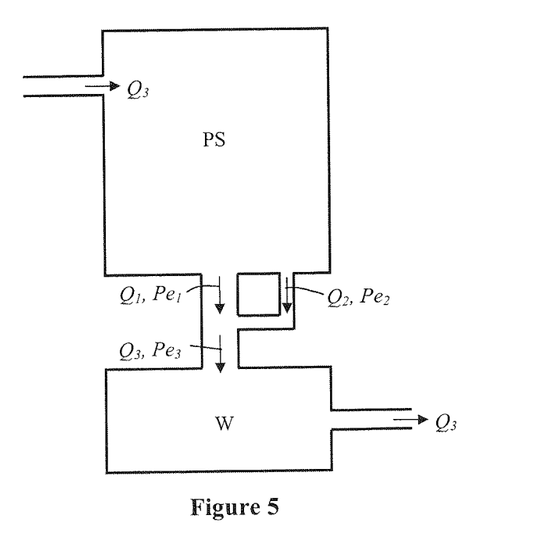
FIG. 5 is a diagram that illustrates the flow of gas in the lithographic apparatus.

The suppression R for the overall system (i.e., the opening 20 and the gap 38) may be determined using the following equation, which should be interpreted in conjunction with FIG. 5 (in which Q2, Pe2 represent the flow and Péclet number respectively in the gap 38):

$$\ln(R) = Pe_3 + \ln\left(\frac{Q_1 + Q_2}{Q_1 e^{-Pe_1} + Q_2 e^{-Pe_2}}\right) \quad (5)$$

Equation (5) indicates that a low value of Pe2 (for the gas flow in the gap 38) does not have a significant effect if the bulk flow Q2 is of gas through the gap is relatively low. Typically, the bulk flow Q2 of gas through the gap 38 is less than 5 times, less than 10 times, less than 20 or more times than the bulk flow Q1 of gas through the opening 20. Thus, the gap 38 does not have a significant effect on the suppression ratio R provided by the opening 20. The suppression ratio R for both of the above illustrative examples may be in excess of 10000.

Although the illustrative examples use water as an example contaminant, the invention may be used to suppress contaminants other than water (e.g., heavier contaminants). Although Hydrogen and Nitrogen are used in the illustrative examples, other gases may be used (e.g., helium, neon, argon, krypton, or oxygen).

The opening 20 may be considered to be a funnel that funnels gas from the projection system PS towards the substrate W.

Although FIGS. 3a,b and 4 show the mirror 13 as being the same height at either side of the opening 20, the mirror may have different heights at either side of the opening. Similarly, the length of the sloped surface 34 of the mirror 13 may be greater on one side of the opening than on an opposite side of the opening. In some instances, one or more parts of the opening 20 that is formed by the mirror 13 may have a surface that is not sloped (e.g., part of the surface may be vertical).

Although FIGS. 3a,b and 4 show the projection system wall 30 as being the same height at either side of the opening 20, the projection system wall may have different heights at either side of the opening. Similarly, the length of the sloped surface 32 of the wall 30 may be greater on one side of the opening 20 than on an opposite side of the opening.

Figure 6A:
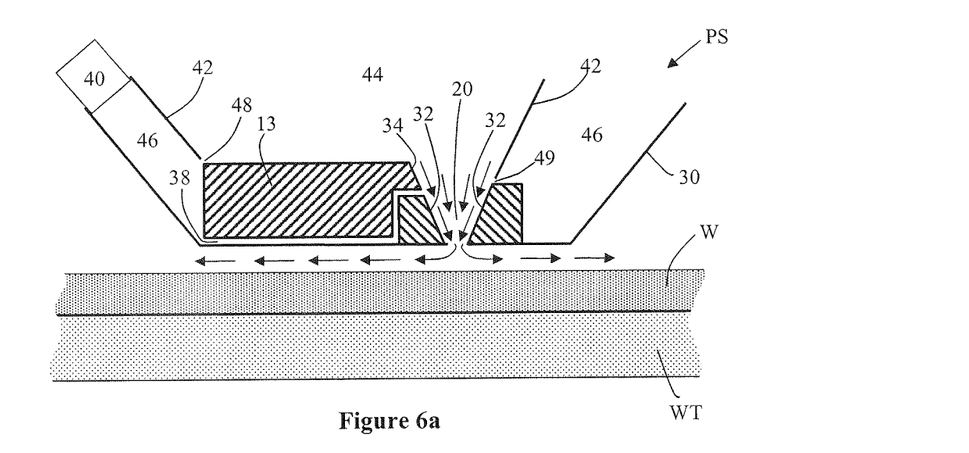
FIGS. 6*a,b* are a schematic illustration of part of the lithographic apparatus according to an alternative embodiment of the invention.
Figure 6B:
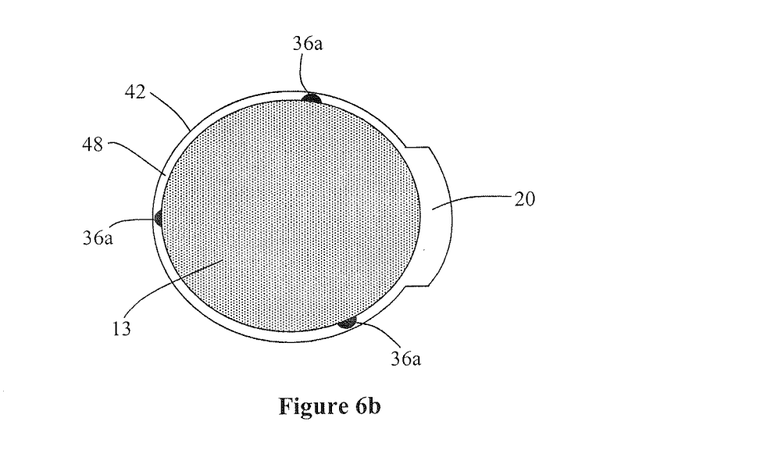

FIG. 6a shows schematically viewed from one side an alternative embodiment of the invention. FIG. 6b shows schematically the embodiment viewed from above. The embodiment corresponds generally to that shown in FIGS. 3a,b, and features of the embodiment that are common with features of the embodiment of FIGS. 3a,b are given the same reference numerals. In the embodiment of FIGS. 6a,b, an interior wall 42 is present in the projection system PS, and separates an inner portion 44 of the projection system from an outer portion 46 of the projection system. The inner portion 44 of the projection system is held at a pressure, which is higher than the outer portion 46 of the projection system.

Also shown in FIG. 6b are mounting points 36a to which mounting arms (not shown) are connected. Any suitable number of mounting points may be provided, at any suitable locations. The mounting arms form part of a frame (not shown), which also supports the next mirror 14 of the projection system. The frame is mechanically independent from the exterior wall 30 and the interior wall 42 of the projection system PS, and the minor 13 may thus move relative to the walls of the projection system. A gap 38 is provided between the mirror 13 and the wall 30 of the projection system PS, in order to ensure that the mirror does not touch the wall of the projection system when it moves. The gap 38 may be a few millimeters. For example, the gap may be between 1 mm and 8 mm.

The interior wall 42 extends towards the mirror 13, but does not come into contact with the mirror 13. Instead, there is a gap 48 between the interior wall 42 and the mirror 13, which allows the mirror 13 to move without touching the interior wall 42. The gap 48 can be seen in FIG. 3b, in which an innermost edge of the interior wall 42 is shown. The gap 48 may be a few millimeters. Gas is able to flow through the gap 48 from the inner portion 44 of the projection system to the outer portion 46 of the projection system.

Unlike the embodiment shown in FIGS. 3a,b, the mirror 13 does not extend fully around the opening 20. Instead, the mirror is located only at one side of the opening 20. For this reason, part of the interior wall 42 does not extend towards the mirror 13, but instead extends towards the sloped surface 32 of the projection system exterior wall 30. A gap 49 is present for mechanical reasons between the interior wall 42 and the sloped surface 32 of the exterior wall of the projection system 30. The gap 49 may be a few millimeters. The gap 49 allows gas to flow from the interior portion 44 of the projection system to the exterior portion 46 of the projection system. For ease of illustration the sloped surface 32 of the projection system exterior wall 30 and the gap 49 are not shown in FIG. 6b. The gap 49 may be omitted in some embodiments.

A pump 40 is located in the exterior portion 46 of the projection system PS. The pump 40 is used to pump gas from the exterior portion 46 of the projection system.

The sloped surface 32 of the projection system and the sloped surface 34 of the mirror 13 together form part of the opening 20. The angle of their slopes may be matched to, or substantially matched to, the angular extent of the EUV radiation beam of the lithographic apparatus. The sloped surface 32 of the projection system and the sloped surface 34 of the minor 13 thus act to increase the suppression ratio R provided by the opening 20.

The interior wall 42 of the projection system in the vicinity of the opening 20 is sloped at an angle that corresponds with the angle of the sloped surface 32 of the exterior wall of the projection system 30. Furthermore, an inner surface of the interior wall 42 is aligned with the sloped surface 32 of the exterior wall of the projection system. The interior wall 42 thus acts to increase the suppression ratio R provided by the opening 20 in an equivalent manner to the sloped surface 34 of the mirror 13. The angle of slope of the interior wall 42 of the projection system in the vicinity of the opening 20 may be matched to, or substantially matched to, the angular extent of the EUV radiation beam of the lithographic apparatus.

In FIGS. 6a,b the interior wall 42 is sloped (in the vicinity of the opening 20) at the same angle as the sloped surface 34 of the minor 13. However, the interior wall 42 may have a different angle of slope, and/or may have more than one angle of slope. For example, the interior wall 42 may have a slope in the vicinity of the opening 20 that matches or substantially matches the angular extent of the EUV radiation beam, and may have a different slope further away from the opening 20. The interior wall 42 in the vicinity of the opening 20 may have any suitable slope.

FIG. 6a shows the sloped surface 32 of the projection system wall as extending higher on the right hand side of the opening 20 than on the left hand side of the opening. However, the sloped surface 32 may be the same height on both sides of the opening, or may extend lower on the right hand side of the opening 20 than on the left hand side of the opening. The sloped surface 32 may extend to any suitable height, and the heights may be different on either side of the opening.

Figure 7A:
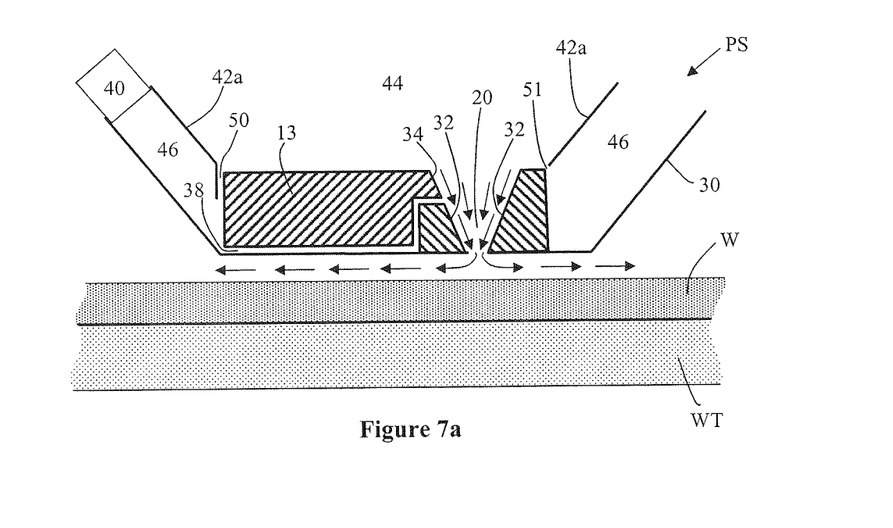
FIGS. 7a,b are a schematic illustration of part of the lithographic apparatus according to an alternative embodiment of the invention.
Figure 7B:
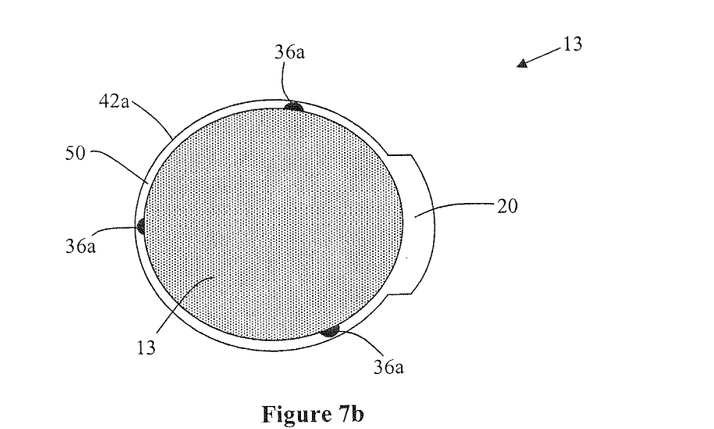

FIG. 7a shows schematically viewed from one side an alternative embodiment of the invention. FIG. 7b shows schematically the embodiment viewed from above. The embodiment of FIGS. 7a,b corresponds largely with the embodiment of FIGS. 6a,b, and features of the embodiment that are common with features of the embodiment of FIGS. 6a,b are given the same reference numerals.

In common with the embodiment shown in FIGS. 6a,b, an interior wall 42a is present in the projection system PS, and separates an inner portion 44 of the projection system from an outer portion 46 of the projection system. The inner portion 44 of the projection system is held at a pressure that is higher than the outer portion 46 of the projection system. As can be seen at the left hand side of FIG. 7a, the interior wall 42a extends downwards beyond an uppermost corner of the mirror 13, and establishes a channel 50 between the interior wall 42a and an outer surface of the mirror 13. Gas may flow through the channel 50 from the interior portion 44 of the projection system PS to the exterior portion 46 of the projection system.

In common with the embodiment of FIGS. 6a,b, the mirror 13 does not extend fully around the opening 20, but instead is to one side of the opening. The sloped surface 32 of the projection system wall 30 extends further than in the embodiment of FIGS. 6a,b, such that an uppermost end of the sloped surface 32 is at the same height as an uppermost surface of the mirror 13 (or is at substantially the same height). The interior wall 42a extends downwards towards the sloped surface 32 of the exterior wall of the projection system 30. A gap 51 is present between the interior wall 42a and the exterior wall of the projection system 30. The gap 51 allows gas to flow from the interior portion 44 of the projection system to the exterior portion 46 of the projection system.

The sloped surface 32 of the projection system and the sloped surface 34 of the mirror 13 together form the opening 20. The angle of their slopes may be matched to, or substantially matched to, the angular extent of the EUV radiation beam of the lithographic apparatus. The sloped surface 32 of the projection system and the sloped surface 34 of the mirror 13 thus act to increase the suppression ratio R provided by the opening 20. The sloped surface 32 of the projection system and the sloped surface 34 of the mirror 13 may have any suitable angle of slope.

The interior wall 42a does not form part of the opening 20, and in the illustrated embodiment does not have an angle of slope that corresponds with the angle of slope of the sloped surface 32 of the exterior wall of the projection system 30. The interior wall 42a may have any suitable shape.

Also shown in FIG. 7b are mounting points 36a to which mounting aims (not shown) are connected. Any suitable number of mounting points may be provided, at any suitable locations. The mounting arms form part of a frame (not shown), which also supports the next mirror 14 of the projection system. The frame is mechanically independent from the exterior wall 30 and the interior wall 42 of the projection system PS, and the mirror 13 may thus move relative to the walls of the projection system. A gap 38 is provided between the mirror 13 and the wall 30 of the projection system PS, in order to ensure that the mirror does not touch the wall of the projection system when it moves. The gap 38 may be a few millimeters. For example, the gap may be between 1 mm and 8 mm.

FIG. 7a shows the sloped surface 32 of the projection system wall as extending as high as the uppermost surface of the mirror 13. However, the sloped surface 32 may extend to any suitable height.

In an embodiment, the interior wall 42a is omitted.

Figure 8:
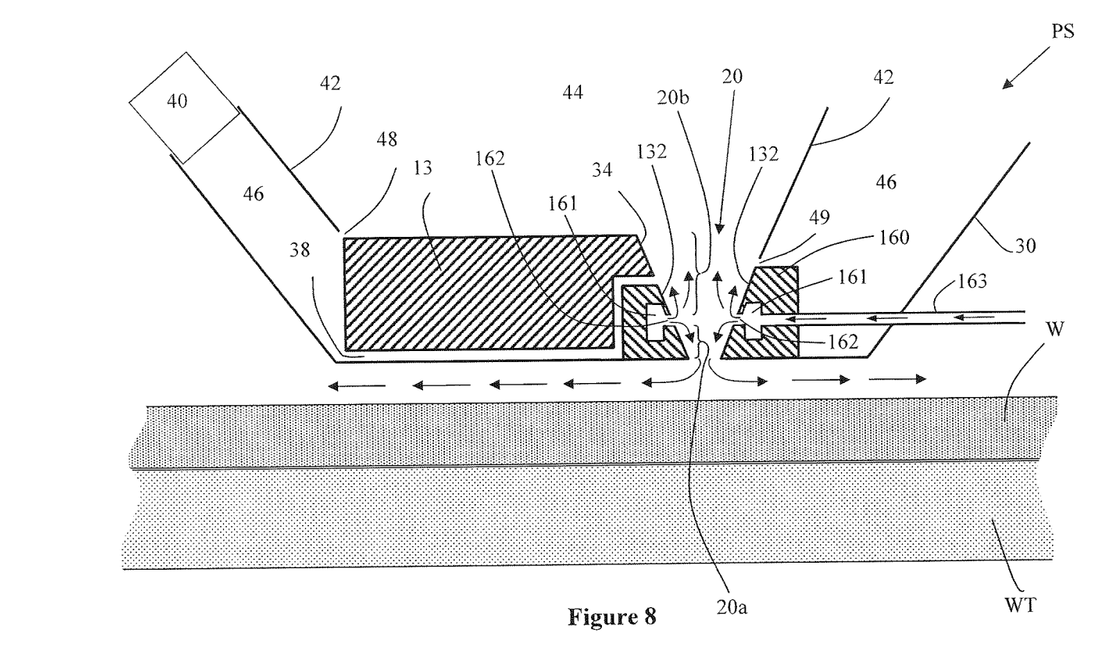
FIG. 8 is a schematic illustration of part of the lithographic apparatus according to an alternative embodiment of the invention.

FIG. 8 shows schematically viewed from one side an alternative embodiment of the invention. The embodiment of FIG. 8 corresponds in part with the embodiment of FIGS. 6a,b, and features of the embodiment that are common with features of the embodiment of FIGS. 6a,b are given the same reference numerals.

In common with the embodiment of FIGS. 6a,b, the mirror 13 does not extend fully around the opening 20, but instead is to one side of the opening. The sloped surface 132 of the projection system and the sloped surface 34 of the mirror 13 together form part of the opening 20. The angle of their slopes may be matched to, or substantially matched to, the angular extent of the EUV radiation beam of the lithographic apparatus.

On an opposite side of the opening 20 the mirror 13 is not present. The sloped surface 132 of the projection system and an interior wall 42 of the projection system PS together form part of the opening 20. The interior wall 42 in the vicinity of the opening 20 is sloped at an angle that corresponds with the angle of the sloped surface 132 of the exterior wall of the projection system 30. The angle of slope of the interior wall 42 of the projection system in the vicinity of the opening 20 may be matched to, or substantially matched to, the angular extent of the EUV radiation beam of the lithographic apparatus.

The interior wall 42 separates an inner portion 44 of the projection system PS from an outer portion 46 of the projection system. The inner portion 44 of the projection system is held at a pressure that is higher than the outer portion 46 of the projection system. As can be seen at the left hand side of FIG. 8, the interior wall 42 extends to an uppermost corner of the mirror 13, but a gap 48 through which gas may flow is present between the interior wall and the mirror. Similarly, as can be seen at the right hand side of FIG. 8, the interior wall 42 extends to an uppermost end of the sloped surface 132 of the exterior wall of the projection system, but a gap 49 through which gas may flow is present between them. Gas may flow from the interior portion 44 of the projection system PS to the exterior portion 46 of the projection system. A pump 40 is located in the exterior portion 46 of the projection system PS. The pump 40 is used to pump gas from the exterior portion 46 of the projection system.

The sloped surface 132 of the projection system PS is provided on a structure 160 that extends around the opening 20. A chamber 161 is provided within the structure 160, the chamber forming a loop within the structure. An outlet 162 is provided part-way up the sloped surface 132 of the structure 160, the outlet being connected to the chamber 161. The height of the outlet 162 is less than the height of the chamber 161. A conduit 163 is connected to the chamber 161 and is configured to deliver gas to the chamber (as indicated by arrows). The gas that is received by the chamber 161 may travel around the chamber such that the pressure of gas is at least partially equalized within the chamber.

Gas flows from the chamber 161 out of the outlet 162 and into the opening 20 between the projection system and the substrate W. A proportion of the gas flows through a lower portion of the opening 20a towards the substrate W, and is then directed between the outer wall 30 of the projection system and the substrate W (as indicated by arrows). The flow of gas through the lower portion of the opening 20a suppresses contamination from passing into the projection system PS in the manner described further above. Referring to equation (2) further above, the suppression ratio R depends upon the mass flow rate Q of the gas, the suppression length L (i.e. height of the lower portion of the opening 20a), and the effective cross section A of the lower portion of the opening 20a. As can be seen from FIG. 8, the suppression length L of the lower portion of the opening 20a may be less than the suppression length of openings in embodiments illustrated in other figures. However, the suppression ratio R may be improved by increasing the mass flow rate Q of gas through the lower portion of the opening 20a. The mass flow rate of the gas is increased by the gas that is provided from the outlet 162.

An advantage of the embodiment shown in FIG. 8 is that it allows the mass flow rate Q of gas passing through the lower portion of the opening 20a to be increased without having to increase the pressure of gas throughout the projection system PS. This is advantageous because increasing the pressure of gas in the projection system PS will cause increased absorption of EUV radiation by the gas, thereby reducing the intensity of EUV radiation projected onto the substrate W and reducing the throughput of the lithographic apparatus. Increasing the flow rate Q of gas by supplying gas from the outlet 162 causes a localised increase of gas pressure in the vicinity of the opening 20, but this localised gas pressure increase causes significantly less absorption of EUV radiation than an increase of the gas pressure throughout the projection system PS. The path length of the EUV radiation through the opening 20 is sufficiently low that the gas present in the opening may cause negligible absorption of the EUV radiation.

A proportion of the gas flows upwards through an upper portion of the opening 20b (as indicated by arrows). This flow of gas does not contribute towards contamination suppression. It may therefore be desirable to limit the amount of gas that flows upwards from the opening 20. The flow of gas is determined by the flow resistance of the upper portion of the opening 20b, which is determined in part by the diameter and length of an upper portion of the opening 20. For this reason, the upper portion of the opening 20b is formed in part by the sloping surface 34 of the mirror 13 (providing a longer opening than would be the case if the mirror were not used to form part of the opening). In addition, the upper portion of the opening 20b is formed in part by the sloped inner wall 42 (providing a longer opening than would be the case if the sloped inner wall were not used to form part of the opening). The angle of the slope of the sloping surface 34 of the minor 13 and the sloped inner wall 42 may be matched to, or substantially matched to, the angular extent of the EUV radiation beam of the lithographic apparatus. Similarly, the angle of the slope of the sloped surface 132 of the structure 160 may be matched to, or substantially matched to, the angular extent of the EUV radiation beam of the lithographic apparatus. This may minimize, or substantially minimize, the proportion of gas that flows through the upper portion of the opening 20*b*. This in turn may maximize, or substantially maximize, the proportion of gas that flows through the lower portion of the opening 20*a*, thereby improving the suppression ratio R provided by the gas.

The proportion of gas that flows through the lower portion of the opening 20*a* (as opposed to flowing through the upper portion of the opening 20*b*) may for example be in the range 0.1 to 0.5, and may for example be in the range 0.15 to 0.25. The proportion may for example be modified through changing the pressure of gas supplied via the conduit 163 or changing the geometry of the opening 20.

The gas pressure in the projection system may for example be in the range 1-10 Pa. However, a higher pressure than this may be provided at the opening 20. For example, a pressure in the range of 20-50 Pa may be provided in the opening 20. The pressure may be higher in the vicinity of the outlet 162 than for example in middle of the opening 20. At least some of the gas that flows through the upper portion of the opening 20*b* may pass through the gaps 48, 49 into the exterior portion 46 of the projection system, and may be pumped from the projection system by the pump 40.

Although the opening 162 is shown as a single opening, a plurality of openings may be provided instead of a single opening.

Although in the embodiment shown in FIG. 8 the mirror 34 is provided on only one side of the opening 20, the mirror may extend around the opening (for example in the manner shown in FIG. 5.

Different features of the above described embodiments of the invention may be combined together.

The EUV radiation beam may have a cone shape when it is at the opening 20. Consequently, the EUV radiation beam may be the to have a radiation cone surface. References in the above description to matching or substantially matching the angles of slopes to the angular extent of the radiation beam may be considered to be equivalent to matching the angles of slopes to the radiation cone surface of the radiation beam. The radiation beam may be patterned during operation of the lithographic apparatus.

In the above embodiments, the wall 30 of the projection system PS may be formed from any suitable material, such as for example steel, aluminum, etc. The mirror 13 may be formed from any suitable material, for example steel, glass, aluminum, etc.

In the above description the projection system PS is held at a higher pressure than the environment of the substrate W. In some instances only part of the projection system is held at the higher pressure (e.g., a part that contains one or more mirrors of the projection system).

The source SO described above in relation to the figures is a laser produced plasma (LPP) source. In an alternative embodiment of the invention, the source SO is a discharge produced plasma (DPP) source.

Although specific reference may be made in this text to the use of lithographic apparatus in the manufacture of integrated circuits, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

Although specific reference may have been made above to the use of embodiments of the invention in the context of optical lithography, it will be appreciated that the invention may be used in other applications.

The terms "radiation" and "beam" used herein encompass all types of electromagnetic radiation, including ultraviolet (UV) radiation (e.g., having a wavelength of or about 365, 355, 348, 193, 157 or 126 nm) and extreme ultra-violet (EUV) radiation (e.g., having a wavelength in the range of 5-20 nm).

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A lithographic apparatus comprising:
   a projection system configured to project a patterned beam of radiation onto a substrate, the projection system being provided with an opening at an end of the projection system through which the patterned beam of radiation and a gas flow may pass,
   wherein at least part of the opening comprises:

a sloped surface of a non-mirror wall of the projection system that is exposed to the gas flow passing through the opening, and a sloped surface of a mirror of the projection system that is exposed to the gas flow passing through the opening, and wherein the gas flow passing through the opening suppresses contamination from passing into the projection system.

2. The lithographic apparatus of claim 1, wherein the sloped surface of the non-mirror wall of the projection system is sloped at an angle that is substantially matched to a surface of a radiation cone of the patterned beam of radiation.

3. The lithographic apparatus of claim 2, wherein the sloped surface of the mirror is sloped at an angle that is substantially matched to a surface of a radiation cone of the patterned beam of radiation.

4. The lithographic apparatus of claim 3, wherein the sloped surface of the mirror and the sloped surface of the non-mirror wall of the projection system are sloped at substantially the same angle.

5. The lithographic apparatus of claim 4, wherein the sloped surface of the mirror and the sloped surface of the non-mirror wall are aligned.

6. The lithographic apparatus of claim 5, wherein all of the opening comprises a sloped surface of a non-mirror wall of the projection system and a sloped surface of a mirror of the projection system.

7. The lithographic apparatus of claim 1, wherein the sloped surface of the mirror is sloped at an angle that is substantially matched to a surface of a radiation cone of the patterned beam of radiation.

8. The lithographic apparatus of claim 7, wherein the sloped surface of the mirror and the sloped surface of the non-mirror wall of the projection system are sloped at substantially the same angle.

9. The lithographic apparatus of claim 8, wherein the sloped surface of the mirror and the sloped surface of the non-mirror wall are aligned.

10. The lithographic apparatus of claim 9, wherein all of the opening comprises a sloped surface of a non-mirror wall of the projection system and a sloped surface of a mirror of the projection system.

11. The lithographic apparatus of claim 1, wherein a gap is provided between the mirror and the non-mirror wall of the projection system.

12. A lithographic method comprising:

projecting a patterned beam of radiation through an opening at an end of a projection system onto a substrate; and holding at least part of the projection system at a pressure that is higher than a pressure at the substrate such that gas flows through the opening from the projection system towards the substrate, wherein at least part of the opening comprises a sloped surface of a non-mirror wall of the projection system that is exposed to the gas flow passing through the opening and a sloped surface of a mirror of the projection system that is exposed to the gas flow passing through the opening, and wherein the gas flow passing through the opening suppresses contamination from passing into the projection system.

13. The method of claim 12, further comprising providing the sloped surface of the non-mirror wall of the projection system with a slope, at an angle that is substantially matched to a surface of a radiation cone of the patterned beam of radiation.

14. The method of claim 13, further comprising providing the sloped surface of the mirror and the sloped surface of the non-mirror wall of the projection system with slopes at substantially the same angle.

15. The method of claim 13, further comprising providing the sloped surface of the mirror with a slope at an angle that is substantially matched to a surface of a radiation cone of the patterned beam of radiation.

16. The method of claim 12, further comprising providing the sloped surface of the mirror with a slope at an angle that is substantially matched to a surface of a radiation cone of the patterned beam of radiation.

17. The method of claim 16, further comprising providing the sloped surface of the mirror and the sloped surface of the non-mirror wall of the projection system with slopes at substantially the same angle.

18. The method of claim 16, further comprising providing all of the opening with a sloped surface.

19. The method of claim 12, further comprising providing a gap between the mirror and the non-mirror wall of the projection system.

* * * * *